US008791547B2

(12) United States Patent
Schneider et al.

(10) Patent No.: US 8,791,547 B2
(45) Date of Patent: Jul. 29, 2014

(54) AVALANCHE DIODE HAVING AN ENHANCED DEFECT CONCENTRATION LEVEL AND METHOD OF MAKING THE SAME

(75) Inventors: Jens Schneider, Munich (DE); Kai Esmark, Neuried (DE); Martin Wendel, Hohenbrunn (DE)

(73) Assignee: Infineon Technologies AG, Neubiberg (DE)

( * ) Notice: Subject to any disclaimer, the term of this patent is extended or adjusted under 35 U.S.C. 154(b) by 570 days.

(21) Appl. No.: 12/017,263

(22) Filed: Jan. 21, 2008

(65) Prior Publication Data
US 2009/0185316 A1   Jul. 23, 2009

(51) Int. Cl.
H01L 29/861   (2006.01)

(52) U.S. Cl.
USPC ............. 257/603; 257/481; 257/E29.335

(58) Field of Classification Search
CPC . H01L 29/32; H01L 21/263; H01L 29/66136; H01L 29/861
USPC .......... 257/603, E29.335, E21.357, 199, 481; 438/91, 380
See application file for complete search history.

(56) References Cited

U.S. PATENT DOCUMENTS

| | | | | |
|---|---|---|---|---|
| 4,291,329 A * | 9/1981 | Hanes et al. | ............... | 257/176 |
| 4,326,211 A * | 4/1982 | Smeets | ............... | 257/438 |
| 5,023,696 A * | 6/1991 | Ogino | ............... | 257/612 |
| 5,146,297 A | 9/1992 | Collins et al. | | |
| 5,243,205 A * | 9/1993 | Kitagawa et al. | ............... | 257/173 |
| 5,343,065 A * | 8/1994 | Saitou | ............... | 257/355 |
| 6,392,266 B1 * | 5/2002 | Robb et al. | ............... | 257/314 |
| 2001/0011745 A1 * | 8/2001 | Kushida | ............... | 257/329 |
| 2003/0197247 A1 * | 10/2003 | Mauder et al. | ............... | 257/603 |
| 2008/0157150 A1 * | 7/2008 | Shim | ............... | 257/292 |
| 2009/0050970 A1 | 2/2009 | Schneider et al. | | |

OTHER PUBLICATIONS

Finkelstein, H., et al., "STI-Bounded Single-Photon Avalanche Diode in a Deep-Submicrometer CMOS Technology," IEEE Electron Device Letters, Nov. 2006, pp. 887-889, vol. 29, No. 11, IEEE.
Jackson, J.C., et al., "Defect Passivation and Dark Count in Geiger-mode Avalanche Photodiodes," 41st Annual International Reliability Physics Symposium, 2003, 2 pp., IEEE.
Jackson, J.C., et al., "Process Monitoring and Defect Characterization of Single Photon Avalanche Diodes," Proceedings of the IEEE 2001 International Conference on Microelectronic Test Structures, Mar. 2001, pp. 165-170, vol. 14, IEEE.
McIntyre, R.J., "On the Avalanche Initiation Probability of Avalanche Diodes Above the Breakdown Voltage," IEEE Transactions on Electron Devices, Jul. 1973, pp. 637-641, vol. Ed-20, No. 7, IEEE.

* cited by examiner

*Primary Examiner* — Kimberly Rizkallah
*Assistant Examiner* — Duy T Nguyen
(74) *Attorney, Agent, or Firm* — Slater & Matsil, L.L.P.

(57) ABSTRACT

The invention relates to an avalanche diode that can be employed as an ESD protection device. An avalanche ignition region is formed at the p-n junction of the diode and includes an enhanced defect concentration level to provide rapid onset of avalanche current. The avalanche ignition region is preferably formed wider than the diode depletion zone, and is preferably created by placement, preferably by ion implantation, of an atomic specie different from that of the principal device structure. The doping concentration of the placed atomic specie should be sufficiently high to ensure substantially immediate onset of avalanche current when the diode breakdown voltage is exceeded. The new atomic specie preferably comprises argon or nitrogen, but other atomic species can be employed. However, other means of increasing a defect concentration level in the diode depletion zone, such as an altered annealing program, are also contemplated.

25 Claims, 7 Drawing Sheets

AVALANCHE DIODE HAVING AN ENHANCED DEFECT CONCENTRATION LEVEL AND METHOD OF MAKING THE SAME

TECHNICAL FIELD

An embodiment of the invention relates generally to integrated circuits, semiconductor devices, and methods, and more particularly to ESD (electrostatic discharge) and EOS (electrical overstress) protection devices with an enhanced level of defects and method of protecting an integrated circuit against electrostatic discharge and electrical overstress.

BACKGROUND

As electronic circuits continue to become smaller and are widely applied in unprotected environments, it has become easier to either completely destroy or otherwise impair electronic components therein by application of voltages beyond component ratings. In particular, many integrated circuits and semiconductor devices are highly susceptible to damage from the unintended discharge of static electricity, generally as a result of handling or from physical contact with another charged body, or from electrical overstress. Electrostatic discharge is the transfer of an electric charge between bodies at different electrostatic potentials (voltages), caused by direct contact, or induced by an electrostatic field. Electrical overstress generally refers to the occurrence of a transient voltage in a circuit above its rated operating voltage. These events have become a critical problem for the electronics industry.

Device failures that result from ESD or EOS events are not always immediately catastrophic or apparent. Often, the device is only slightly weakened but is less able to withstand normal operating stresses and, hence, may result in a reliability problem. Therefore, various ESD and EOS protection circuits should be included in the device to protect its various components.

When an ESD discharge or EOS event is coupled to a transistor or other semiconductor element, the high voltage and current of the ESD pulse or EOS event relative to the voltage- and current-sustaining capabilities of structures within the device can break down the transistor, and potentially cause immediate or latent damage. Consequently, circuits associated with input/output pads of an integrated circuit require protection from an ESD pulse and an EOS event so that they are not damaged by such occurrences.

TLP (transmission line pulsing) data of ESD (electro-static discharge) protection devices in various semiconductor technologies show an inhibited avalanche breakdown phenomenon during the duration of a short ESD pulse (~100 ns). The voltage developed across the devices during an ESD pulse can reach values which are 10-15 volts higher than measured dc breakdown voltages, i.e., measured breakdown voltages applied for longer intervals of time. For example, a device exposed to a short-duration ESD pulse can exhibit a peak breakdown voltage of 45 volts, whereas a longer duration ESD pulse may exhibit a breakdown voltage of only 28 volts for the same device.

ESD protection devices are designed to carry a high current while clamping the voltage below the destruction voltages of functional devices and circuits during ESD pulses. The occurrence of voltages higher than the originally intended value can lead to ESD failures within the functional circuitry.

ESD devices exhibiting such inhibited breakdown phenomena may show a tendency to failure during ISO (International Organization for Standardization) short test pulses, which are frequently used for qualification of automotive and industrial products.

Thus, there is a need for ESD/EOS protection devices capable of fast turn-on of avalanche breakdown under ESD, EOS, and ISO test pulse conditions, thereby preventing failure of circuits and products using these devices for ESD protection.

SUMMARY OF THE INVENTION

In accordance with an exemplary embodiment, an avalanche diode is provided. The avalanche diode can be coupled, without limitation, to an external circuit node in an electronic system to provide ESD/EOS protection for the circuit node. The avalanche diode includes an anode region, a cathode region adjoining the anode region, and an avalanche ignition region formed in a region surrounding juncture of the anode region with the cathode region. The avalanche ignition region is formed with an enhanced defect concentration level over a defect concentration level of the anode region and/or the cathode region. In an advantageous embodiment, the avalanche ignition region is created by placement therein of a second atomic specie that is different from the atomic specie forming the principal diode crystal structure. In an advantageous embodiment, the second atomic specie is placed by ion implantation. The avalanche ignition region provides reliable and fast turn-on of avalanche breakdown when a reverse-bias voltage is applied to the diode that exceeds the diode breakdown voltage. In an advantageous embodiment, a bipolar transistor is formed with an integral avalanche ignition region. In an advantageous embodiment, the bipolar transistor is coupled between bias voltage supply rails of an electronic system.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views. For a more complete understanding of the invention, reference is now made to the following descriptions taken in conjunction with the accompanying drawings, in which:

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely an ESD/EOS protection arrangement including a semiconductor device. The semiconductor device includes a depletion region with an enhanced level of defects to provide rapid onset of an avalanche condition. The invention may also be applied, however, to other semiconductor structures, and is not limited to this particular implementation. Other integrated circuits can be protected from ESD/EOS discharges in different contexts using inventive concepts described herein.

For semiconductor devices operating at voltages generally less than 5 to 6 volts, Zener diodes are a frequent choice for overvoltage protection. Zener diodes clamp a voltage by relying on the tunneling effect between a conduction band and a valence band in a semiconductor device. This effect operates with minimal clamping delay, relying only on charge transport between two substantially adjacent regions of the device associated with energy levels of the conduction band and the valence band. For devices designed to clamp higher voltage levels, such as 12 volts or more, an avalanche mechanism is often employed to start the voltage-clamping action of a snap-back device. An avalanche mechanism relies on the continued generation of free carriers by crystal defects in a high-field region of the device crystal structure, as described later hereinbelow. The avalanche mechanism thus successively produces free carriers that are created by energy-absorbing collisions of initial free carrier(s) with bound carriers of the crystal structure. The newly created free carriers are accelerated by a high electric field in the device so that they absorb sufficient energy to produce further free carriers, and the process continues.

Devices relying on an avalanche mechanism for voltage clamping generally exhibit a delay between application of an overvoltage condition and the clamping action. This delay is a consequence of the need for one or more initial free carriers to start the avalanche process. Initial free carriers are generated by a thermally actuated process, for example, a thermally actuated electron-hole generation process described by Poisson process statistics. The bound carriers from which the free carriers are generated are generally found in crystal defects. Since semiconductor devices are carefully produced employing highly purified material sources, the number of free carriers produced by such a thermally driven statistical process is generally limited, resulting in substantial delay for the voltage-clamping action. Accordingly, such higher voltage clamping devices are frequently ineffective for ESD or EOS applications because of the delayed voltage clamping response.

An ideal ESD/EOS protection device for a terminal of a functional device to be protected, such as an output pin, should preferably satisfy several characteristics. It should turn on very quickly relative to the timeframe of an ESD discharge or EOS voltage transient. It should conduct the substantial currents associated with the event, such as one ampere or more for 100 ns for an ESD discharge. It should not require a large amount of device area for its implementation. And it should not load the protected terminal with substantial resistance or capacitance. The device should also exhibit a breakdown voltage that is not substantially increased for short-duration charge pulses. In addition, any added protection structure should ideally not require substantial additional processing steps during device manufacture, such as an additional masking step, which would increase device cost. And ideally, no additional processing steps would be required.

The phenomenon of delayed avalanche breakdown for short pulses and its remediation are not recognized in the literature for devices intended for ESD/EOS applications. The issue of preventing rapid avalanche breakdown is well known, however, in the avalanche photodiode literature where inhibition of avalanche breakdown is a desired phenomenon, which is opposite to the needs of devices employed for ESD/EOS protection. For example, the following papers discuss avalanche breakdown in photodiodes: R. J. McIntyre, "On the Avalanche Initiation Probability of Avalanche Diodes above the Breakdown Voltage," IEEE Transactions on Electron Devices, Vol. 20, Jul., 1973, pp. 637-641; H. Finkelstein, et al., "STI-Bounded Single-Photon Avalanche Diode in a Deep-Submicrometer CMOS Technology," IEEE Electron Device Letters, Vol. 27, Nov. 2006, pp. 887-889; and J. C. Jackson, et al., "Defect Passivation and Dark Count in Geiger-Mode Avalanche Photodiodes," IEEE 41st Annual International Reliability Physics Symposium, Mar. 30, 2003, Dallas, Tex., pp. 586-587, ("Jackson").

Avalanche breakdown of p-n junctions is employed in snap-back ESD devices to trigger the device into a high current, voltage-clamping regime, as described in U.S. patent application Ser. No. 11/844,965, entitled "Diode-Based ESD Concept for DEMOS Protection," filed Aug. 24, 2007, which is hereby referenced and incorporated herein.

Avalanching is a phenomenon driven by high electric fields (i.e., electric fields greater than $10^5$ V/cm) in a depletion zone of a reverse-biased diode. Initial free charge carriers (i.e., electrons and holes) such as produced by a thermally actuated process are accelerated across the depletion zone and produce further electron/hole pairs by impact ionization. These secondary charge carriers are accelerated by an internal electric field, which may lead to avalanche of carriers for a sufficiently high internal electric field, and thus to a high breakdown current. This breakdown/avalanche process is also referred to as "carrier multiplication." Other physical effects (e.g., Auger recombination, wherein energy is transferred to a third carrier such as another electron), and band-to-band recombination, can reduce the number of charge carriers due to electron-hole recombination, thus damping the avalanche process.

The avalanche process starts when the initial number of electrons and holes exceeds a certain threshold value, and damping processes related to carrier recombination enable high enough carrier multiplication. The initial number of carriers depends on temperature (i.e., by means of thermal carrier generation) and on the number of defects in the semiconductor that produce so-called deep trapping states in the energy band-gap of the material. These trapping states act as centers for Shockley-Read-Hall generation and recombination. These defects might originate either from crystal defects or from electrically neutral impurity atoms, e.g., argon, nitrogen, or gold.

In the field of single-photon detection, the phenomenon of delayed avalanche response is well known and is used to build "Single Photon Avalanche Diodes" (SPADs). For SPADs, a diode is brought into the so-called Geiger mode, i.e., it is reverse biased above the dc breakdown voltage. After a brief period of time, the diode avalanches, either due to absorption of a photon, or spontaneously due to thermally initiated free-carrier generation, which occurs randomly over time. The reverse-biasing voltage is removed to terminate the avalanching phenomenon, and is then reapplied. This mode of sustaining a reverse-bias voltage higher than a dc avalanche voltage, if only for a brief period of time, can only be reached if the number of electrons and holes in the depletion zone and in its vicinity is very low. A single photon entering the reverse-biased p-n region of the diode can then produce sufficient charge carriers to start the avalanche process, producing a current peak and a drop in diode voltage. Ionizing particles such as alpha particles and other high-energy particles can also produce the same effect. Particle detectors can be built relying on this phenomenon.

An important figure of merit in SPAD development is the so called "dark count rate," i.e., the number of avalanche breakdowns per unit of time without photons entering the reverse-biased p-n region. The dark count rate is strongly dependent on the defect distribution within the semiconductor material, and, of course, crystal temperature. To achieve low dark count rates, SPADs are often manufactured using epitaxial silicon layers (typically 5-10 μm in height) with low defect densities on a lightly doped silicon wafer. A low defect density insures long carrier lifetimes, and thus low or retarded avalanche probabilities. J. C. Jackson, et al., in the paper entitled "Process Monitoring and Defect Characterization of Single Photon Avalanche Diodes," Proc. IEEE Int. Conference on Microelectronic Test Structures, Mar. 19, 2001, pp. 165-170, describe the use of avalanche rate ("dark count rate") to assess the level of crystal defects, and thereby provide a measure of manufacturing quality for the semiconductor device.

Process details such as different annealing times can significantly alter defect densities and therefore dark count rates in SPADs, and the associated avalanche breakdown probability, as described by Jackson for Geiger-mode avalanche photodiodes.

For ESD/EOS protection devices relying on avalanche breakdown, the breakdown during an ESD/EOS pulse should appear under all working conditions and as quickly as possible. This is usually the case for recently designed CMOS technologies, e.g., those formed with structures 140 nm and smaller, which tend to have higher defect densities. As described hereinabove, this is not always the case for ESD devices, particularly those formed in bipolar technologies where epitaxial silicon layers are used to form deep, vertical, bipolar devices. The low defect density in the epitaxial layer guarantees a high current gain of the vertical transistors. But low defect density also leads to inhibition of avalanche breakdown as described hereinabove for SPADs, i.e., to achieve desired low dark-count rates. To insure fast avalanche response properties of such ESD/EOS devices to provide the necessary ESD/EOS voltage-clamping action, high dark count rates are needed, i.e., very fast avalanche ignition is required.

Fast avalanche response can be produced in a device, constructed according to a preferred embodiment, by introducing additional process steps and/or by tuning existing process steps to insure fast avalanching. This is accomplished by increasing the defect density and the concentration of deep traps in an appropriate region of an ESD device, referred to herein as an avalanche ignition region, particularly in the depletion region of a p-n junction that is formed during reverse biasing.

Several methods can be employed to increase defect density and the concentration of deep traps in an avalanche ignition region overlying at least a portion of a depletion region of a p-n junction. One method is to implant or otherwise place additional impurity atoms in the avalanche ignition region to create deep trap levels, e.g., without limitation, argon, germanium, nitrogen, gold, oxygen, carbon, and others. Among these, argon and nitrogen are preferred impurity placement species. Another method is to change the annealing steps to alter impurity diffusion, as described by Jackson for Geiger-mode avalanche photodiodes to produce a tolerance for high breakdown voltage. Changes can also be made in the epitaxial growth of silicon to produce more defects. This can be accomplished by adding impurity atoms directly to the epitaxial-growth process. The impurity atoms might also be implanted into the semiconductor substrate before the epitaxial-growth process so that they can diffuse into the depletion region of the avalanche diode during annealing steps which occur later in the process flow.

If a special mask for the adjustment of the breakdown voltage is used, impurity atoms, such as argon, gold, germanium, or others as described above, can be implanted through this mask to locally change the defect density in the avalanche ignition region overlying at least a portion of a depletion region of a p-n junction.

An anneal step after the formation of the p-n junction can be tuned, preferably to shorter anneal times, to result in higher remaining defect densities.

The growth of a silicon epitaxial layer with an increased defect density level can be accomplished by adding impurity atoms to the gaseous material stream forming the epitaxial layer. This must be restricted to the part of the epitaxial layer that lies at the same depth as the p-n junction, which is formed later in the process, to insure that other functional devices, e.g., vertical bipolar devices, are not adversely affected, for example their I/V-characteristics.

Figure 1:
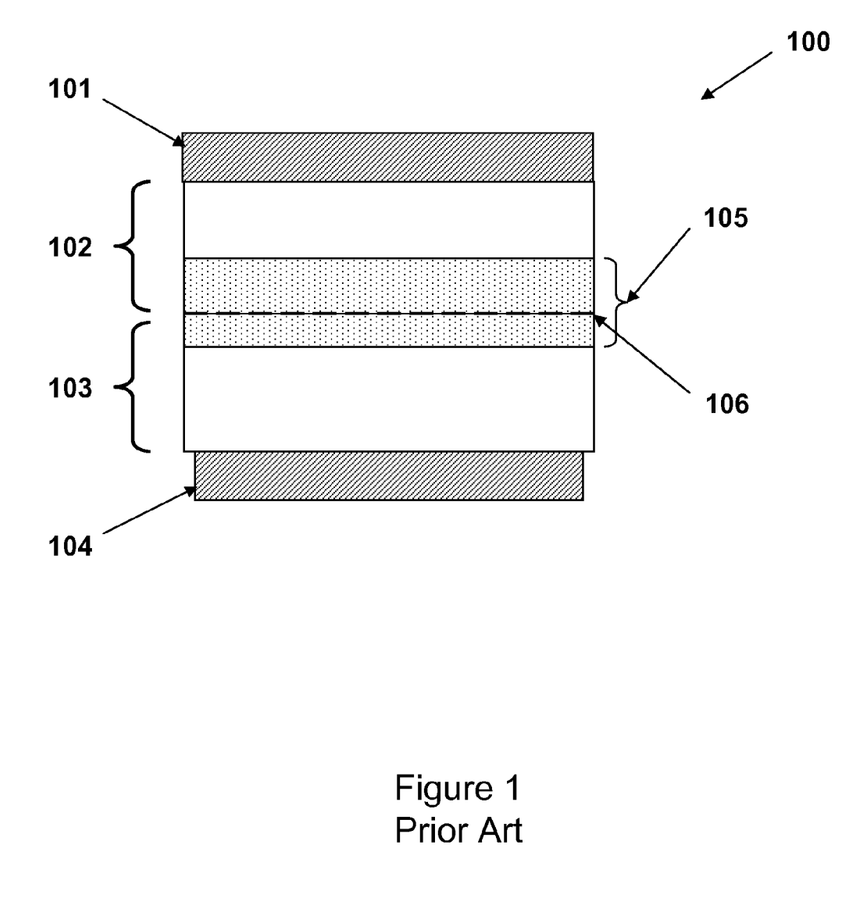
FIG. 1 illustrates a cross-sectional drawing of an exemplary avalanche diode, formed employing techniques of the prior art.

Turning now to FIG. 1, illustrated is a cross-sectional drawing of a representative avalanche diode 100 formed employing techniques of the prior art. The avalanche diode is formed substantially as a single crystal with a p-doped layer 102 epitaxially deposited above and in contact with an n-doped layer 103. A p-n junction 106 is thereby produced between the p-doped layer and the n-doped layer. An ohmic anode contact 101 is formed above and in contact with the p-doped layer 102, for example, by diffusion of an appropriate doping specie such as boron to form a highly doped p-type region, followed by a metallic deposition thereon, for example, a metallic deposition of gold or nickel or a combination thereof. Similarly, an ohmic cathodic contact 104 is formed below and in contact with the n-doped layer 103, for example, by diffusion of an appropriate doping specie such as phosphorus to form a highly doped n-type region, followed by a metallic deposition thereon, for example, a metallic deposition of gold or nickel, or a combination thereof.

In this and in following figures, it is recognized that boundaries between different regions of a semiconductor device are not abrupt, and may gradually blend together. Nonetheless, such boundaries between regions in the figures will be illustrated with lines, which do not reflect the gradation of doping densities that may occur between adjacent regions.

When the avalanche diode 100 is reverse-biased, i.e., when the anode contact 101 is coupled to a lower potential then the cathode contact 104, a depletion zone 105 substantially devoid of free carriers is formed between the p-doped region 102 and the n-doped region 103, producing thereby an absence of significant conduction in the avalanche diode. At sufficiently high reverse-bias voltage, avalanche is initiated, enabling conduction, generally after a delay as described previously hereinabove.

Figure 2A:
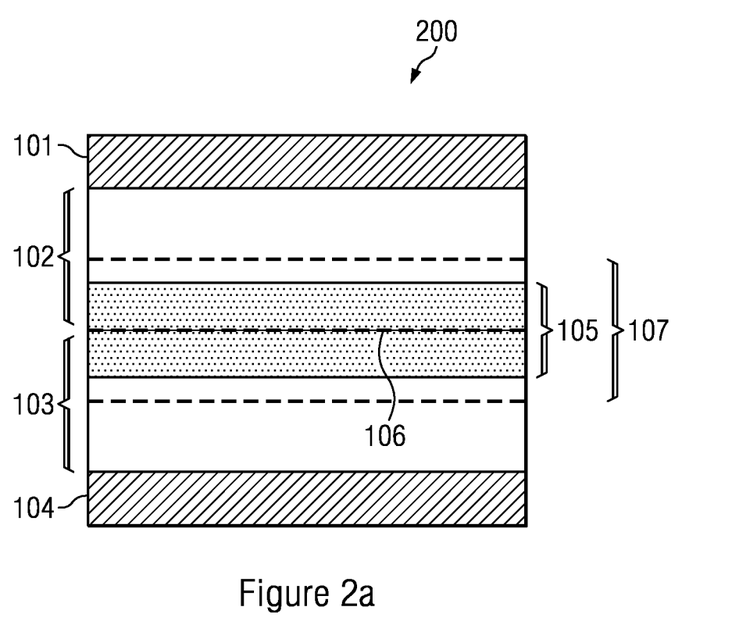
FIG. 2a illustrates a cross-sectional drawing of an avalanche diode, constructed according to an exemplary embodiment.
Figure 2B:
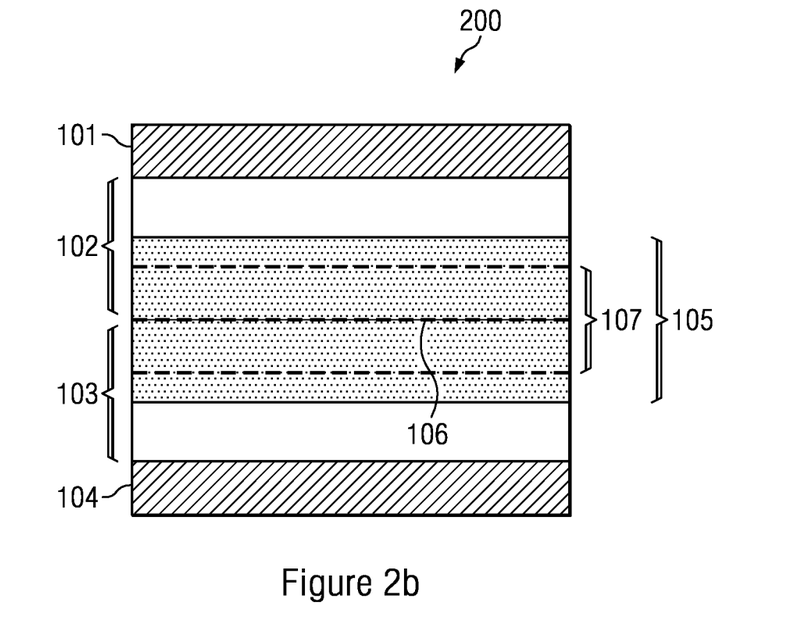
FIG. 2b illustrates a cross-sectional drawing of an avalanche diode, constructed according to an exemplary embodiment.

Turning now to FIGS. 2a and 2b, illustrated is a cross-sectional drawing of an avalanche diode 200. The avalanche diode 200 in FIG. 2a advantageously provides a reliable and fast turn-on of avalanche breakdown, formed according to an embodiment. The avalanche diode 200 is formed similar to the avalanche diode 100 described with reference to FIG. 1, with the exception of a defect placement/avalanche ignition region 107 formed in the portion of the diode where the depletion zone 105 is created under a reverse-bias condition. The avalanche ignition region can be formed by ion implantation, preferably with neutral atomic specie such as, without limitation, argon, nitrogen, germanium, gold, oxygen, carbon, and others. A preferred implantation density for an implanted defect-producing atomic specie is about $10^{15}$-$10^{18}$ per $cm^3$. The implanted atoms create dislocations in the crystal structure, producing thereby thermally actuated free carriers as described previously hereinabove. In this manner, significant conduction can be produced under reverse-bias conditions with substantially immediate onset of avalanche current. Substantially immediate onset of avalanche current refers to onset of avalanche current in a time frame roughly sorter than an ESD event, which can be less than 2 ns in the "charge device ESD model." Remaining elements in FIG. 2 with the same reference designation as previous figure, as in later figures, will not be redescribed in the interest of brevity.

Figure 3:
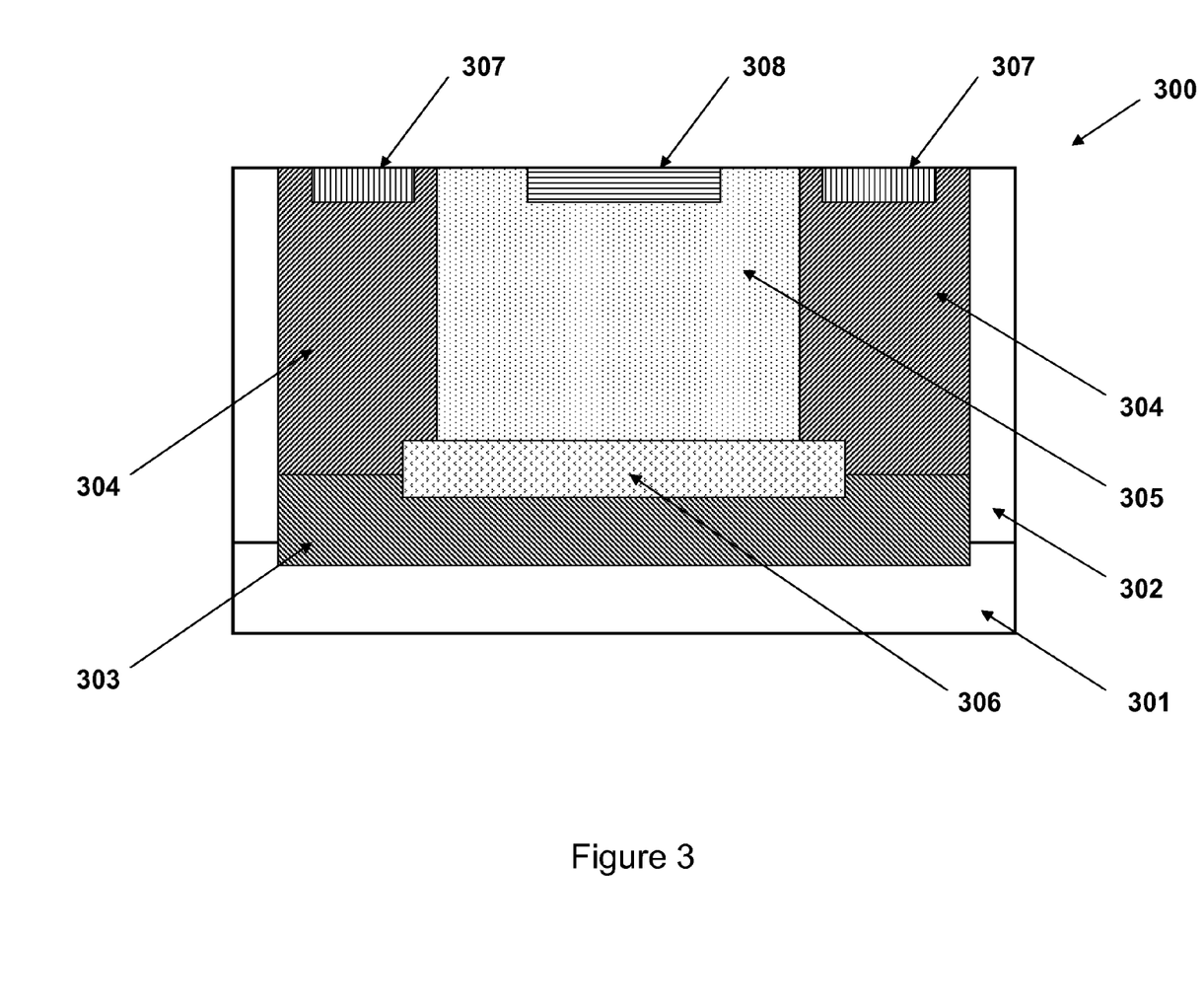
FIG. 3 illustrates a cross-sectional drawing of an avalanche diode, constructed according to an exemplary embodiment.

Turning now to FIG. 3, illustrated is a cross-sectional drawing of an avalanche diode 300, advantageously providing reliable and fast turn-on of avalanche breakdown, formed according to an exemplary embodiment. A preferred semiconductor material for an avalanche diode is silicon, but other semiconductor materials such as, without limitation, gallium arsenide may also be used. The avalanche diode 300 is formed by epitaxial deposition of an n-doped layer 302, such as a phosphorus-doped layer, above a p-doped substrate 301, such as a phosphorus-doped substrate. An n-well 304 is formed in the n-doped layer 302. An n-buried layer 303 is created below the n-well 304, such as by ion implantation of phosphorus, and annealing. The n-buried layer 303 might also be created by ion implantation before the epitaxial deposition. A p-well 305 is formed above the n-buried layer 303, such as by ion implantation or diffusion of boron, followed by annealing. A defect implantation/avalanche ignition region 306 is produced in a region between the p-well 305 and the n-buried layer 303 by ion implantation of a suitable atomic specie such as described hereinabove. Avalanche ignition region 306 is preferably formed in the portion of the diode where a depletion zone is created under a reverse-bias condition. The avalanche ignition region is formed preferably by ion implantation of an atomic specie, as previously described hereinabove. An avalanche ignition region can also be formed by alternative methods within the broad scope of the invention, for example, by altering the epitaxial-growth process to produce more defects. For example, this can be accomplished by adding impurity atoms directly to the epitaxial-growth process. The impurity atoms might also be implanted or otherwise placed into the semiconductor substrate before the epitaxial-growth process so that they can diffuse into the depletion region of the avalanche diode during annealing steps which occur later in the process flow.

An ohmic anode contact 308 is formed above the p-well 305, for example, by diffusion or implantation of an appropriate doping specie such as boron to form a highly doped p-type region, e.g., to produce a doping level of $10^{19}$ per $cm^3$ or above, followed by a metallic deposition thereon, for example, a metallic deposition of gold or nickel or a combination thereof. Similarly, an ohmic cathodic contact 307 is formed in n-well 304, for example, by diffusion or implantation of an appropriate doping specie such as phosphorus, e.g., to produce a doping level of $10^{19}$ per $cm^3$ or higher, to form a highly doped n-type region, followed by a metallic deposition thereon, for example, gold or nickel, or a combination thereof.

The structure illustrated by the cross-sectional drawings in FIGS. 2 and 3 represents a cross-sectional drawing of a three-dimensional structure that may be a linear structure in a third direction out of the plane of the figure, or, without limitation, may be a three-dimensional structure with circular symmetry.

The detailed processing steps to form an epitaxial layer, to diffuse or implant an atomic specie into a semiconductor lattice structure, to anneal a crystal after an implant, as well as other processing steps to form a semiconductor device, are well-known in the art, including the necessary doping densities and atomic species to produce a device usefully operable at a required application voltage, and will not be described further herein in the interest of brevity.

Figure 4:
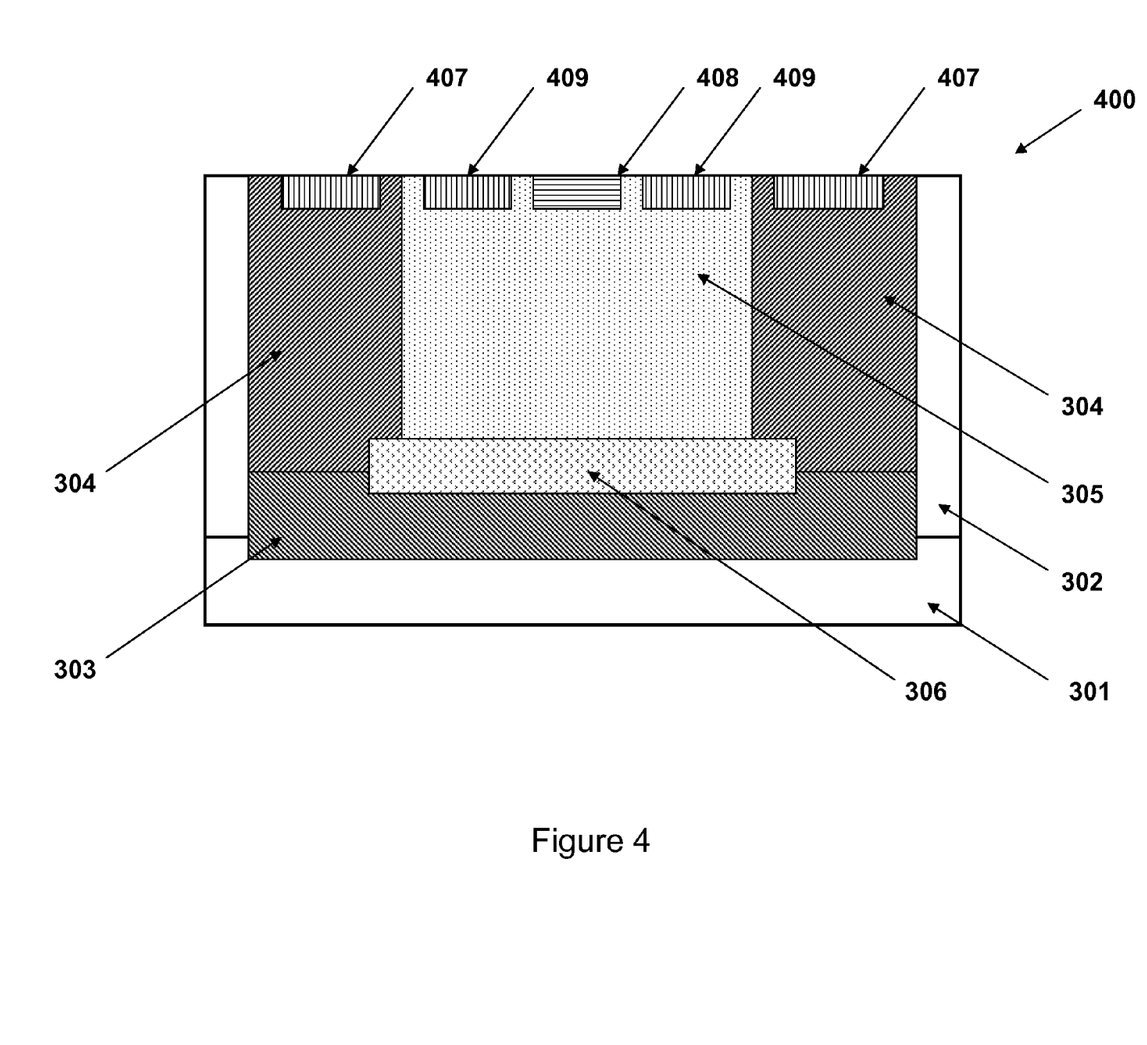
FIG. 4 illustrates a cross-sectional drawing of an avalanche diode in a bipolar transistor, constructed according to an exemplary embodiment.

Turning now to FIG. 4, illustrated is cross-sectional drawing of a bipolar npn transistor 400 including an integral avalanche diode that provides a rapid avalanche ignition region, formed according to an advantageous embodiment. The integral avalanche diode advantageously provides reliable and fast turn-on of avalanche breakdown and bipolar transistor action. A base contact 408 is formed above p-well 305, for example, by diffusion or implantation of an appropriate doping specie such as boron to form a highly doped p-type region, e.g., to produce a doping level of $10^{19}$ per $cm^3$ or above, followed by a metallic deposition thereon, for example, a metallic deposition of gold or nickel or a combination thereof. Collector contact 407 is formed in n-well 304, for example, by diffusion or implantation of an appropriate doping specie such as phosphorus, e.g., to produce a doping level of $10^{19}$ per $cm^3$ or higher, to form a highly doped n-type region, followed by a metallic deposition thereon, for example, gold or nickel, or a combination thereof. Similarly, emitter contact 409 is formed above p-well 305, for example, by diffusion or implantation of an appropriate doping specie with doping density graded as necessary, followed by a metallic deposition thereon, for example, a metallic deposition of gold or nickel or a combination thereof.

Figure 5:
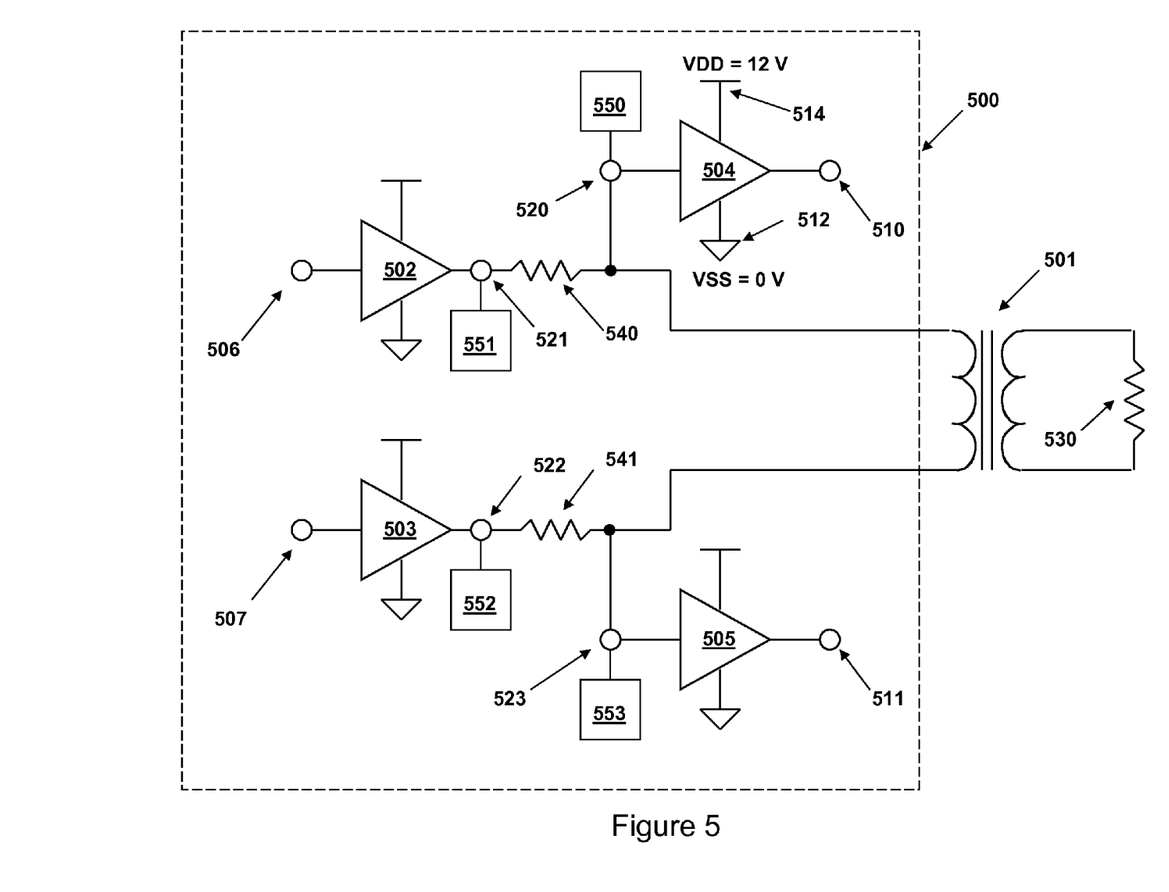
FIG. 5 illustrates a digital subscriber line line-driver circuit including avalanche breakdown diodes with defect implantation for ESD protection of output nodes, constructed according to an exemplary embodiment.

Turning now to FIG. 5, illustrated is a digital subscriber line (DSL) line-driver circuit 500 including ESD/EOS protection for output nodes, preferably formed as an integrated circuit, constructed according to an exemplary embodiment. A DSL line-driver circuit is an exemplary system application of an avalanche breakdown diode with defect placement to reduce carrier lifetime that can be employed for ESD/EOS protection. The DSL line-driver circuit 500 is coupled to isolation and impedance-matching transformer 501, which in turn is coupled to a "twisted pair" subscriber line represented by resistor 530. Resistors 540 and 541 enable the impedance-matching function performed by transformer 501. Line amplifiers 502, 503, 504, and 505 are formed with fine-line semiconductor structures that require ESD/EOS protection for output nodes 520, 521, 522, and 523. The line amplifiers are coupled to bias voltage supply rails represented by VDD+ 12-volt voltage source 514, and VSS ground voltage source 512. A transmit signal from a balanced internal signal source (not shown) in the DSL line-driver circuit is coupled between internal circuit nodes 506 and 507 to transmitter line amplifiers 502 and 503. Duplex communication, i.e., simultaneous communication in both directions, is provided by transmitter line amplifiers 502 and 503, which are coupled to output nodes 521 and 522. Transmitter line amplifiers 502 and 503 operate without interference with receiver line amplifiers 504 and 505, which are coupled to internal circuit nodes 510 and 511 and to input nodes 520 and 523. Each input/output node 520, 521, 522, and 523 is coupled, respectively, to ESD/EOS protection circuit 550, 551, 552, and 553. The ESD/EOS protection circuits are formed with bipolar ESD transistors relying on avalanche diodes with defect implants as illustrated and described hereinabove with reference to FIGS. 2, 3 and 4. Each ESD/EOS protection circuit is coupled to bias rails 512 and 514 as illustrated and described hereinbelow with reference to FIG. 5. The couplings of the ESD/EOS protection circuits to these bias voltage sources are not illustrated in FIG. 5. Thus, a system, preferably formed as an integrated circuit, such as a DSL line-driver circuit, is advantageously formed with ESD/EOS protection for its output nodes employing an avalanche diode with an avalanche ignition region.

Figure 6:
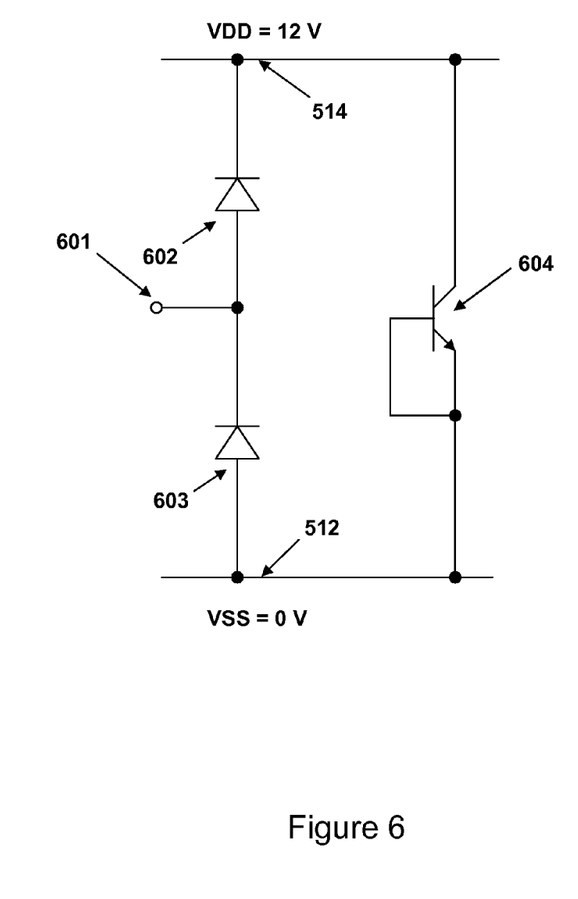
FIG. 6 illustrates an exemplary ESD node protection circuit including an ESD transistor based on an avalanche breakdown diode with defect implantation, constructed according to an exemplary embodiment.

Turning now to FIG. 6, illustrated is an exemplary ESD protection circuit including standard diodes 602 and 603 and bipolar npn transistor 604 relying on a collector-base avalanche diode with an avalanche ignition region for fast avalanche response, constructed according to an advantageous embodiment. The standard diodes 602 and 603 are coupled in series and to bias rails 512 and 514, which are generally designed to exhibit low impedance at the high frequencies of a typical ESD/EOS discharge. The npn transistor 604 is coupled between bias rails 512 and 514, as described in pending U.S. patent application Ser. No. 11/844,965, entitled "Diode-Based ESD Concept for DEMOS Protection," filed Aug. 24, 2007, previously cited hereinabove. The common circuit node between avalanche breakdown diodes 602 and 603 is coupled to circuit node 601, which is an output circuit node to be protected from ESD/EOS discharge.

The concept has been introduced of reducing carrier lifetimes in the depletion zone of a p-n-junction of an ESD/EOS element by implantation or introduction by other means of an atomic specie to create crystal defects, or by reducing or altering annealing of the crystal to preserve crystal defects. In this manner, reliable and fast turn-on of avalanche breakdown is produced.

In accordance with one exemplary embodiment, an avalanche diode includes an anode region, a cathode region adjoining the anode region, and an avalanche ignition region formed in a region surrounding juncture of the anode region with the cathode region. In a preferred embodiment, the avalanche ignition region is formed with an enhanced defect concentration level over a defect concentration level of the anode region and/or the cathode region to provide rapid onset of avalanche current when a breakdown voltage of the diode is exceeded. In a preferred embodiment, the avalanche ignition region is preferably formed wider than a depletion zone of the avalanche diode, wherein the depletion zone is created in a region surrounding the juncture of the anode region with the cathode region. In a preferred embodiment, the depletion zone is created in a region surrounding the juncture of the anode region with the cathode region upon application of a reverse diode voltage. The avalanche ignition region is preferably created by placement of a new atomic specie in the region where the depletion zone is formed that is different from the atomic specie that forms the principal structure of the anode region and the cathode region. In a preferred embodiment, the new atomic specie is placed by ion implantation. In a preferred embodiment, the doping concentration of the new atomic specie is preferably sufficiently high to ensure substantially immediate onset of avalanche current when a diode breakdown voltage is exceeded. In a preferred embodiment, the placed atomic specie preferably comprises argon or nitrogen, but other atomic species can be employed. The doping concentration of the new atomic specie is preferably at least $10^{15}$ per $cm^3$. In a preferred embodiment, the avalanche diode is preferably formed on a silicon substrate, but other semiconductor systems can be advantageously employed, such as gallium arsenide.

Another exemplary embodiment provides a method of constructing an avalanche diode. In an advantageous embodiment, the method includes depositing a first diode region on a substrate, the first diode region oppositely doped from the substrate. The method further includes depositing a second diode region above the first diode region, the second diode region oppositely doped from the first diode region. The method further includes forming an avalanche ignition region in a region surrounding juncture of the first diode region and the second diode region. In an advantageous embodiment, a defect concentration level in the avalanche ignition region is greater than a defect concentration level in the first diode region and/or the second diode region. In an advantageous embodiment, the method includes forming the avalanche ignition region wider than a depletion zone of the avalanche diode, wherein the depletion zone is created in a region that surrounds the juncture of the first diode region with the second diode region. In an advantageous embodiment, the depletion zone is created upon application of a reverse voltage to the avalanche diode. In an advantageous embodiment, the method includes creating the avalanche ignition region by placing an atomic specie different from an atomic specie forming the principal structure of the substrate. In an advantageous embodiment, the method includes placing the atomic specie by ion implantation. In an advantageous embodiment, the method includes producing a doping concentration of the placed atomic specie sufficiently high to ensure substantially immediate onset of avalanche current when a breakdown voltage across the diode is reached. In an advantageous embodiment, the placed atomic specie is argon, but other atomic species can be employed. In a further advantageous embodiment, a doping concentration of the placed atomic specie is at least $10^{16}$ per $cm^3$. In an advantageous embodiment, the method includes forming the avalanche diode on a silicon substrate.

Another exemplary embodiment provides an electronic system including an output pad coupled to an internal circuit, and first and second bias voltage supply rails, and a related method. In an advantageous embodiment, the first and second bias voltage supply rails are coupled to the internal circuit. In an advantageous embodiment, a first ESD diode includes an anode and a cathode. In an advantageous embodiment, the first ESD diode is formed in a standard way. The first ESD diode is coupled to the output pad and to the first bias voltage supply rail. In an advantageous embodiment, a second ESD diode includes an anode and a cathode. In an advantageous embodiment, the second ESD diode is formed in a standard way. The second ESD diode is coupled to the output pad and to the second bias voltage supply rail. In an advantageous embodiment, a bipolar transistor, formed with an integral avalanche ignition region, is coupled between the first and second bias voltage supply rails. In an advantageous embodiment, the avalanche ignition region is formed by placement of a second atomic specie different from the atomic specie forming the principal structure of the respective diode. In an advantageous embodiment, the second atomic specie is placed by ion implantation. In an advantageous embodiment, the placed atomic specie comprises argon, but other atomic species can be employed.

Although an avalanche diode and/or a bipolar transistor formed with an avalanche ignition region and related methods have been described for application to ESD/EOS protection arrangements, it should be understood that other applications of an avalanche diode and/or a bipolar transistor formed with an avalanche ignition region are contemplated within the broad scope of the invention, and need not be limited to ESD/EOS protection arrangements.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A semiconductor device comprising:
   an anode region;
   a cathode region adjoining the anode region;
   an avalanche ignition region formed in a first region surrounding a juncture of the anode region with the cathode region, wherein the avalanche ignition region comprises an enhanced defect concentration level over a defect concentration level of the anode region and the cathode region; and
   a depletion zone created in a second region surrounding the juncture of the anode region with the cathode region, wherein the avalanche ignition region is wider than the depletion zone.

2. The semiconductor device as claimed in claim 1, wherein the depletion zone is created in the second region of the semiconductor device at the juncture of the anode region with the cathode region upon application of a reverse voltage to the semiconductor device.

3. The semiconductor device as claimed in claim 1, wherein the semiconductor device is formed on a silicon substrate.

4. The semiconductor device as claimed in claim 1, wherein the avalanche ignition region comprises an atomic species different from an atomic species forming a principal structure of the anode region and the cathode region.

5. The semiconductor device as claimed in claim 4, wherein the atomic species is placed by ion implantation.

6. The semiconductor device as claimed in claim 4, wherein the atomic species comprises a neutral atomic species.

7. The semiconductor device as claimed in claim 6, wherein the neutral atomic species comprises at least one of argon, nitrogen, carbon, germanium or gold.

8. The semiconductor device as claimed in claim 6, wherein a doping concentration of the neutral atomic species is at least $10^{15}$ per $cm^3$.

9. The semiconductor device as claimed in claim 4, wherein a placement of the atomic species forms dislocations of the atomic species forming the principal structure.

10. The semiconductor device as claimed in claim 1, wherein the avalanche ignition region is smaller than the anode region and the cathode region combined.

11. A semiconductor device comprising:
    an anode region in an epitaxial semiconductor layer;
    a cathode region in the epitaxial semiconductor layer, the cathode region adjacent the anode region;
    an avalanche ignition region formed at a juncture of the anode region with the cathode region, wherein the avalanche ignition region has a higher defect concentration level than the anode region and the cathode region; and
    a depletion region completely within the avalanche ignition region, wherein the depletion region is formed at the juncture.

12. The semiconductor device as claimed in claim 11, wherein the avalanche ignition region comprises a second atomic species different from a first atomic species forming a principal structure of the anode region and the cathode region.

13. The semiconductor device as claimed in claim 12, wherein the second atomic species comprises at least one of argon, nitrogen, carbon, germanium or gold.

14. The semiconductor device as claimed in claim 12, wherein a placement of the second atomic species forms dislocations of the first atomic species.

15. The semiconductor device as claimed in claim 11, wherein the avalanche ignition region is wider than the depletion region, the depletion region disposed in a region surrounding the juncture of the anode region with the cathode region.

16. The semiconductor device as claimed in claim 11, wherein the avalanche ignition region is smaller than the anode region and the cathode region combined.

17. A semiconductor device, comprising:
    a first region, the first region comprising p-type silicon;
    a second region, the second region abutting the first region and the second region comprising n-type silicon;
    a contiguous third region comprising a portion of the first region and a portion of the second region, the contiguous third region comprising a higher concentration level of dislocations in a crystal structure than a remaining portion of the first region and a remaining portion of the second region; and
    a depletion region completely within the contiguous third region, wherein the depletion region is based on a reverse bias voltage.

18. The semiconductor device as claimed in claim 17, wherein the dislocations in the crystal structure comprise a neutral atomic species incorporated in the crystal structure.

19. The semiconductor device as claimed in claim 18, wherein an implantation density of the neutral atomic species is $10^{15}$ -$10^{18}$ per $cm^3$.

20. The semiconductor device as claimed in claim 18, wherein the neutral atomic species is argon, nitrogen, germanium, gold, oxygen or carbon.

21. The semiconductor device as claimed in claim 17, wherein the contiguous third region comprises thermally actuated free carriers.

22. The semiconductor device as claimed in claim 17, wherein the first region and the second region are located in an epitaxial semiconductive layer.

23. An avalanche diode comprising:
    a first region, the first region comprising p-type silicon;
    a second region, the second region abutting the first region and the second region comprising n-type silicon;
    a contiguous third region comprising a portion of the first region and a portion of the second region, the contiguous third region comprising a higher concentration level of dislocations in a crystal structure than a remaining portion of the first region and a remaining portion of the second region; and
    a depletion region is completely within the contiguous third region, wherein the depletion region is based on a reverse bias voltage, and wherein the avalanche diode is configured to provide an onset of an avalanche current in less than 2 ns.

24. The avalanche diode as claimed in claim 23, wherein the dislocations in the crystal structure comprise a neutral atomic species incorporated in the crystal structure.

25. The avalanche diode as claimed in claim 23, wherein the first region and the second region are located in an epitaxial semiconductive layer.

* * * * *